United States Patent
Chang

(10) Patent No.: US 12,374,381 B2
(45) Date of Patent: Jul. 29, 2025

(54) DYNAMIC MEMORY AND CONTROL METHOD FOR POWER DOWN SCHEME

(71) Applicant: Winbond Electronics Corp., Taichung (TW)

(72) Inventor: Kuen-Huei Chang, Taipei (TW)

(73) Assignee: Winbond Electronics Corp., Taichung (TW)

( * ) Notice: Subject to any disclaimer, the term of this patent is extended or adjusted under 35 U.S.C. 154(b) by 182 days.

(21) Appl. No.: 18/366,687

(22) Filed: Aug. 8, 2023

(65) Prior Publication Data

US 2024/0404578 A1 Dec. 5, 2024

(30) Foreign Application Priority Data

Jun. 2, 2023 (TW) ................. 112120682

(51) Int. Cl.
  *G11C 11/00* (2006.01)
  *G11C 11/406* (2006.01)
  *G11C 11/4074* (2006.01)
  *G11C 11/408* (2006.01)

(52) U.S. Cl.
  CPC ..... *G11C 11/4074* (2013.01); *G11C 11/40611* (2013.01); *G11C 11/4082* (2013.01)

(58) Field of Classification Search
  CPC .......... G11C 11/40615; G11C 11/4074; G11C 2211/4067; G11C 11/40611; G11C 11/4072; G11C 11/4076; G11C 11/4082; G11C 11/406; G06F 3/0604; G06F 3/0625; G06F 3/0634; G06F 3/0659; G06F 3/0673; G06F 1/3234; G06F 1/3275; G06F 1/3293
  See application file for complete search history.

(56) References Cited

U.S. PATENT DOCUMENTS 10,754,564 B2 * 8/2020 Choi ................. G11C 11/40615
2022/0091657 A1 3/2022 Tsien

* cited by examiner

Primary Examiner — Thong Q Le
(74) Attorney, Agent, or Firm — JCIPRNET

(57) ABSTRACT

A dynamic memory and a control method for power down scheme are provided. The control method includes: receiving a power down command at a first time point; judging whether the first time point is in an operation period of a burst refresh operation; if the first time point is not in the operation period of the burst refresh operation: calculating a time difference between the first time point and a time point of a next refresh operation according to a second time point of a previous refresh operation and a refresh operation time interval, and determining whether to activate a low power operation mode of the dynamic memory according to the time difference.

16 Claims, 7 Drawing Sheets

DYNAMIC MEMORY AND CONTROL METHOD FOR POWER DOWN SCHEME

CROSS-REFERENCE TO RELATED APPLICATION

This application claims the priority benefit of Taiwan application serial no. 112120682, filed on Jun. 2, 2023. The entirety of the above-mentioned patent application is hereby incorporated by reference herein and made a part of this specification.

BACKGROUND

Technical Field

The invention relates to a dynamic memory and a control method for power down scheme, and in particular, to a dynamic memory capable of effectively saving power consumption and a control method for power down scheme.

Description of Related Art

The power consumption of the dynamic memory can be reduced through a power down command. However, in order to maintain the correctness of the stored data, the dynamic memory will perform an auto-refresh operation regularly. Therefore, if the power is off, the dynamic memory must be woken up to perform the auto-refresh operation when the auto-refresh operation occurs. It is worth noting that the dynamic memory needs additional power consumption when switching between a normal operation state and a power down state. Therefore, if the execution time point of the power down operation is close to the time point of the auto-refresh operation, more power consumption may be generated instead.

SUMMARY

The present invention provides a dynamic memory and a control method for power down scheme, which can effectively save unnecessary power consumption.

The control method for power down scheme includes: receiving a power down command at a first time point; judging whether the first time point is in an operation period of a burst refresh operation; if the first time point is not in the operation period of the burst refresh operation: calculating a time difference between the first time point and a time point of a next refresh operation according to a second time point of a previous refresh operation and a refresh operation time interval, and determining whether to activate a low power operation mode of the dynamic memory according to the time difference.

The dynamic memory includes a memory array and a controller. The controller is coupled to the memory array, and is used for the control method of the above-mentioned power down scheme.

Based on above, the dynamic memory can judge whether executing the power down command to enter the low power operation mode can actually obtain the benefit of saving power according to the time point of receiving the power down command and the occurrence status of the auto-refresh operation. In addition, the switching operation of the low power operation mode is executed accordingly, and the effect of saving power consumption is effectively achieved.

DESCRIPTION OF THE EMBODIMENTS

Figure 1:
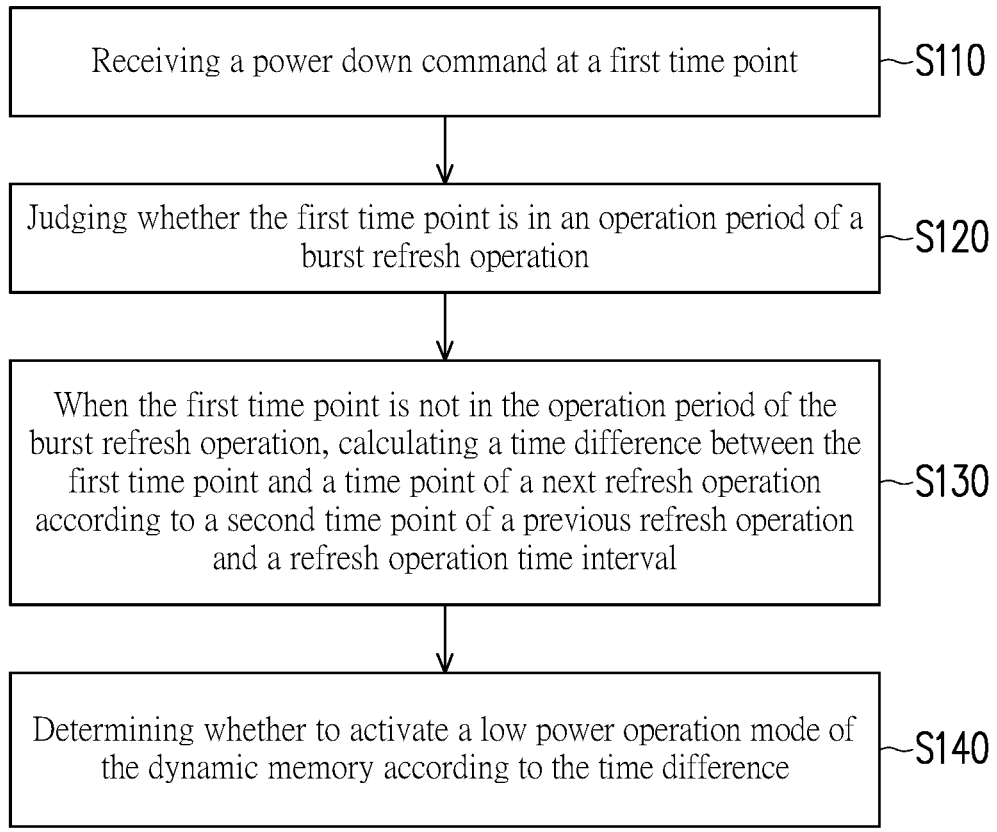
FIG. 1 is a flowchart of a control method of a power down scheme according to an embodiment of the present invention.

The embodiment of FIG. 1 is for a dynamic memory, such as Dynamic Random Access Memory (DRAM). In step S110, the controller of the dynamic memory can receive a power down command at a first time point. In step S120, the controller can judge whether the dynamic memory is in the operation period of the burst refresh operation at the first time point. If it is judged in step S120 that the dynamic memory is not in the operation period of the burst refresh operation, step S130 and step S140 can be executed. If it is judged in step S120 that the dynamic memory is in the operation period of the burst refresh operation, the dynamic memory can execute the waiting operation.

In step S130, the controller can calculate a time difference between the first time point of receiving the power down command and a time point of a next refresh operation according to a second time point of a previous refresh operation and a refresh operation time interval (tREFI). And, the controller can determine whether the time difference mentioned above is long enough to activate a low power operation mode of dynamic memory (step S140).

In details, the controller can preset a time threshold and compare the time threshold with the time difference between the first time point of the power down command and the next refresh operation, so as to judge whether the time difference above is long enough. When the above time difference is greater than the preset time threshold, the controller can activate the low power operation mode of the dynamic memory to save power consumption; in contrast, when the above time difference is not greater than the preset time threshold, the controller does not activate the low power operation mode of the dynamic memory.

It should be noted that, in the embodiment, since the dynamic memory needs to execute an auto-refresh operation regularly, activating the low power operation mode of the dynamic memory arbitrarily may not be able to effectively save power consumption. Therefore, in the embodiment of the present invention, by calculating whether the time difference between the first time point of the power down command and the next refresh operation is long enough, which is used as the basis for whether to activate the low power operation mode of the dynamic memory, so that the power consumption of the dynamic memory can be reduced more effectively.

Figure 2A:
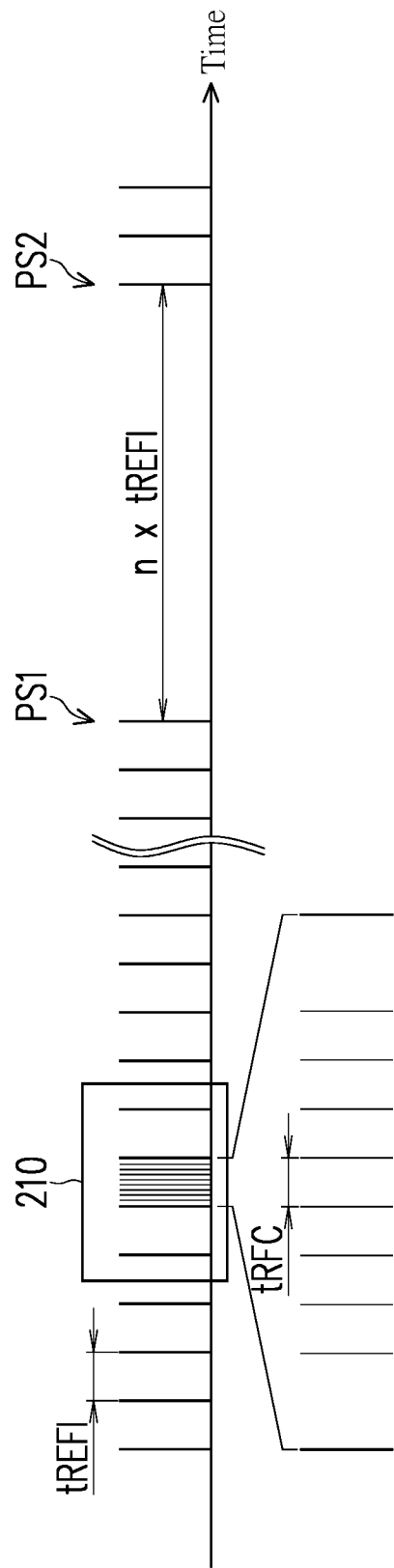
FIG. 2A and FIG. 2B are schematic diagrams of a first implementation detail of the control method of the power down scheme in the embodiment of the present invention.

In FIG. 2A, the horizontal axis is the time axis, and the multiple pulse signals on the time axis represent the auto-refresh operation executed for each row on the dynamic memory. Among them, the auto-refresh operation of the dynamic memory can be divided into a burst refresh operation and a distributed refresh operation. Among them, in a region 210, multiple pulse signals are adjacent to each other, and the time intervals between adjacent pulses are equal to a period tRFC of a row auto-refresh loop is the time interval for executing the burst refresh operation. Outside the region 210, multiple pulses whose time intervals between adjacent pulses are equal to the refresh operation time interval tREFI are used to execute the distributed refresh operation. In addition, there is a relatively long-time interval between a pulse PS1 and a pulse PS2 (equal to n times the refresh operation time interval tREFI, wherein n is an integer greater than 1), which means that a postpone refresh mode is executed. Among them, when the normal distributed refresh operation collides with the access operation, the postpone refresh mode can be executed.

Figure 2B:
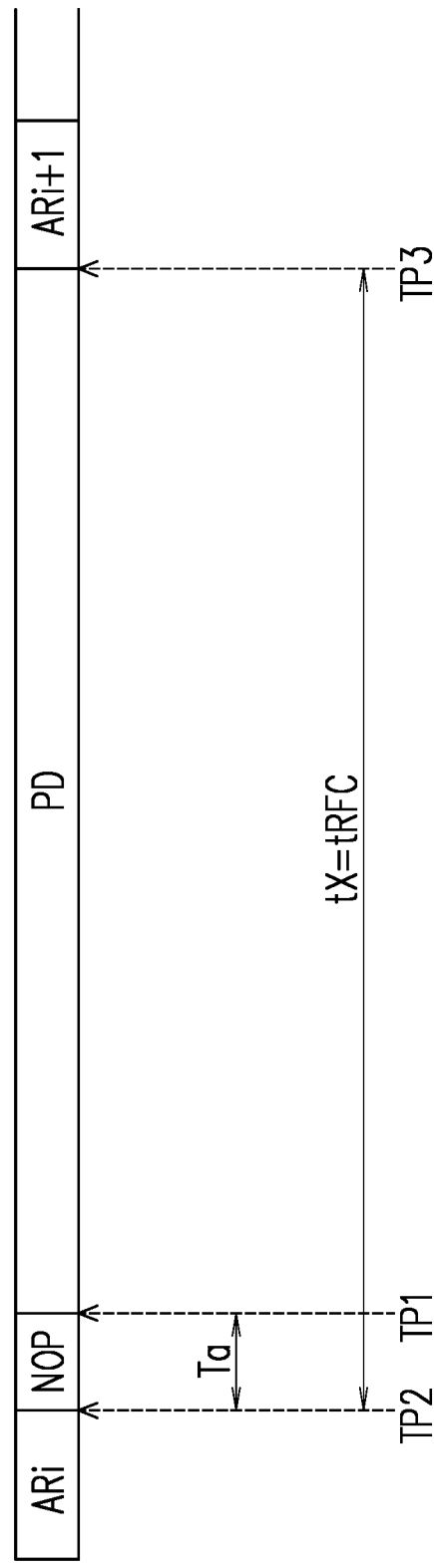

In FIG. 2B, the controller of the dynamic memory can judge whether the first time point receiving the power down command PD is in the operation period of the burst refresh operation. Among them, the controller can receive a refresh operation ARi at a second time point TP2 first, and receive the power down command PD at a first time point TP1 after a time interval Ta generated by the no-operation NOP state. At this time, the controller can determine whether the time interval between the first time point TP1 receiving the power down command PD and the second time point TP2 receiving the refresh operation ARi is greater than the period tRFC of the row auto-refresh loop. Among them, the period tRFC of the row auto-refresh loop is equal to the time interval between the second time point TP2 and a third time point TP3 when the controller receives the next refresh operation ARi+1.

According to FIG. 2B, it can be known that in the operation period (region 210) of the burst refresh operation, the time interval Ta must be less than the period tRFC of the row auto-refresh loop. Therefore, the controller of the dynamic memory can set the period tRFC of the row auto-refresh loop equal to the target value tX, and compare the target value tX with the time interval Ta between the first time point TP1 and the second time point TP2. When the time interval Ta is greater than the period tRFC of the row auto-refresh loop, it can be determined that the first time point TP1 where the power down command PD occurs must not be in the operation period of the burst refresh operation.

Relatively, if the controller of the dynamic memory determines that the time interval Ta is not greater than the period tRFC of the row auto-refresh loop, it cannot be determined whether the first time point TP1 at which the power down command PD occurs is within the operation period of the burst refresh operation. At this time, the controller does not perform any action, and must wait until the subsequent time point when the power down command occurs can be judged as the operation period that did not occur in the burst refresh operation, and then perform subsequent operations related to the power down command.

Figure 3A:
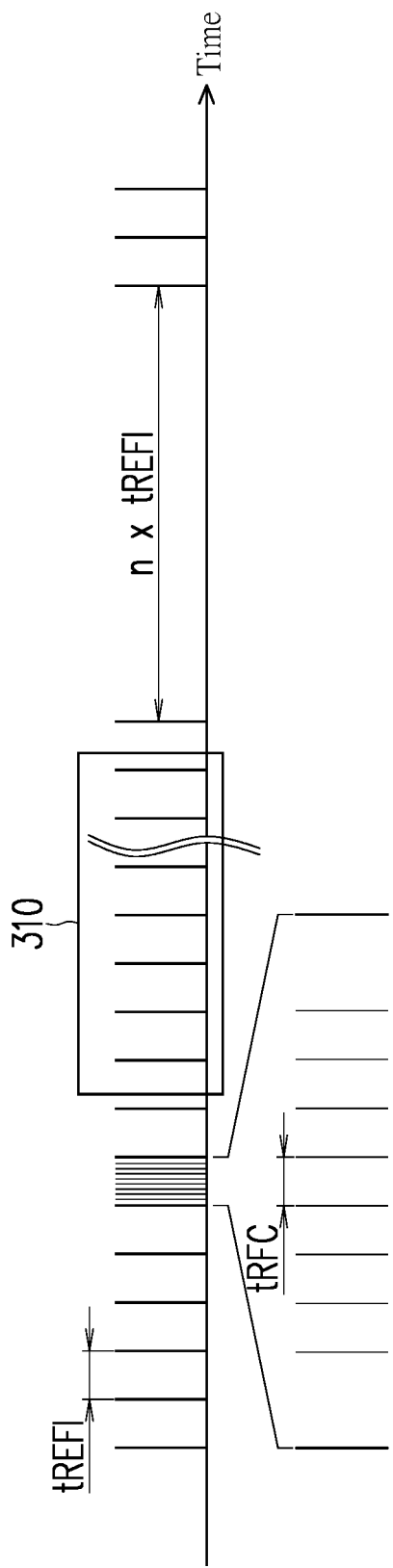
FIG. 3A and FIG. 3B are schematic diagrams of a second implementation detail of the control method of the power down scheme in the embodiment of the present invention.

FIG. 3A is similar to FIG. 2A. In the implementation details, the illustration is mainly focused on a region 310 in FIG. 3A, wherein in the region 310, the dynamic memory is during the operation period of the distributed refresh operation.

Figure 3B:
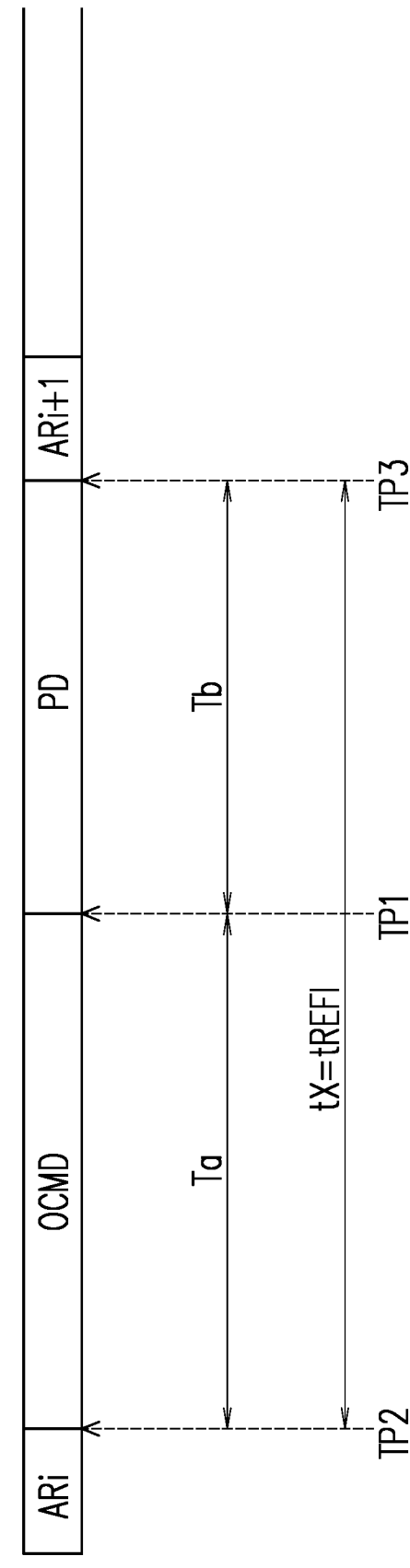

In region 310, in FIG. 3B, the dynamic memory completes the refresh operation ARi at the second time point TP2, receives the power down command PD at the first time point TP1, and receives other commands OCMD between the second time point TP2 and the first time point TP1. The controller of the dynamic memory can judge that the time interval Ta between the first time point TP1 at which the power down command PD is received and the second time point TP2 at which the previous refresh operation ARi occurs is greater than the period tRFC of the row auto-refresh loop. Therefore, it can be judged that the first time point TP1 is not in the operation period of the burst refresh operation. Then, the controller of the dynamic memory can set the refresh operation time interval tREFI defined in the specification of the dynamic memory to be equal to the target value tX, and further compare the target value tX with the time interval Ta. When the target value tX is greater than the time interval Ta, the controller can judge that the first time point TP1 receiving the power down command PD may be the operation period of the normal distributed refresh operation.

At this time, the controller can subtract the difference between the second time point TP2 and the first time point TP1 from the refresh operation time interval tREFI to obtain a time difference Tb. Among them, the time difference Tb may be equal to the time difference between the first time point TP1 receiving the power down command PD and the third time point TP3 of the next refresh operation ARi+1. The controller can further compare the time difference Tb with the preset time threshold, if the time difference Tb is greater than the preset time threshold, the controller can activate the low power operation mode of the dynamic memory; on the contrary, if the time difference Tb is not greater than the preset time threshold, the controller will not activate the low power operation mode of the dynamic memory temporarily.

Figure 4A:
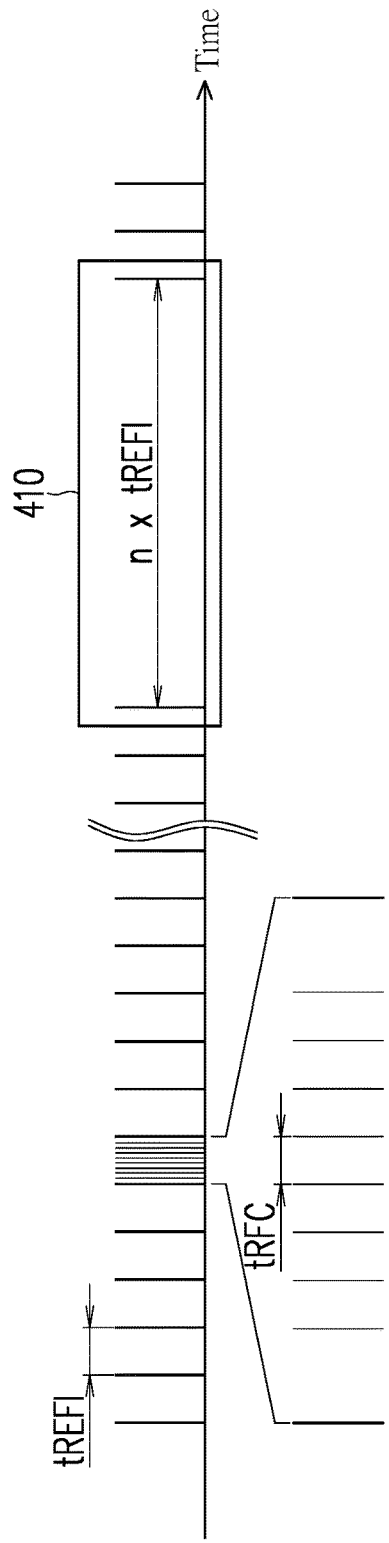
FIG. 4A and FIG. 4B are schematic diagrams of a third implementation detail of the control method of the power down scheme in the embodiment of the present invention.

FIG. 4A is similar to FIG. 2A. In the implementation details, the illustration is mainly focused on a region 410 in FIG. 4A, wherein in the region 410, the dynamic memory is during the operation period of the postpone refresh mode of the distributed refresh operation.

Figure 4B:
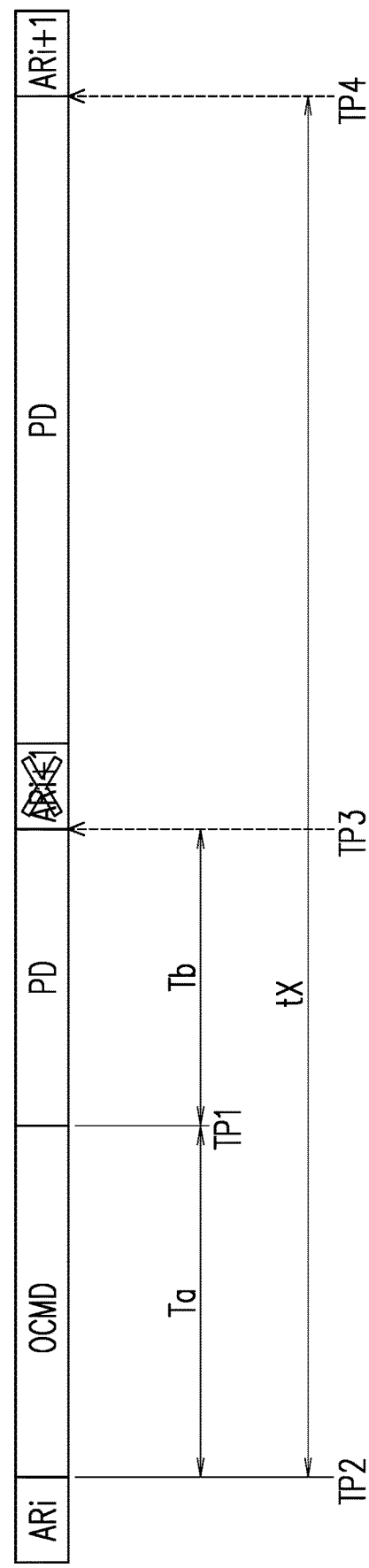

In FIG. 4B, the dynamic memory completes the refresh operation ARi at the second time point TP2, receives the power down command PD at the first time point TP1, and receives other commands OCMD between the second time point TP2 and the first time point TP1. Continuing the description of FIG. 3B, when the time difference Tb is not greater than the preset time threshold, the controller can continuously monitor the status of the external command. If the external command remains in the state of power down command, the time difference Tb will be extended. If at the current time point (equal to the third time point TP3), the refresh operation ARi+1 is not executed. And the sum of the time interval Ta and the time difference Tb is extended to be greater than the sum of the refresh operation time interval tREFI and a threshold value. Correspondingly, the controller can judge that the distributed refresh operation of the dynamic memory is in a postpone refresh mode. The above threshold value can be any number greater than 0, and can be determined by the designer without specific restrictions.

In the present implementation details, the next refresh operation ARi+1 is executed at time point TP4.

When the controller judges that the distributed refresh operation of the dynamic memory operates under the postpone refresh mode, the controller can calculate the product of the refresh operation time interval tREFI and a setting parameter n according to the setting parameter (such as equal to n) of the postpone refresh mode of the dynamic memory. And further set the above product as a target value tX, and then compare the target value tX with the time threshold. When the product of the refresh operation time interval tREFI and the setting parameter n is greater than the time threshold, the controller can activate the low power operation mode of the dynamic memory. In the embodiment, the setting parameter n can be an integer between 2 and 9.

It should be noted that, in the embodiment of the present invention, the time threshold mentioned above can be set according to the power consumption required to switch the dynamic memory to the low power operation mode, compared with the power consumption that can be saved by maintaining the low power operation mode. Specifically, when the time length of maintaining the low power operation mode is equal to the time threshold, the power consumption that can be saved must be greater than the power consumption required to switch the dynamic memory to the low power operation mode.

Incidentally, the time threshold can be associated with ambient temperature. The dynamic memory can set the corresponding time threshold according to the power consumption status under different ambient temperatures, so as to improve the efficiency of power consumption control.

Figure 5:
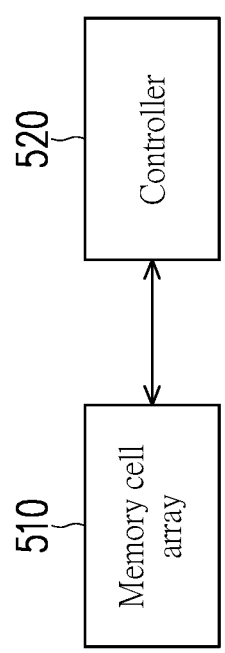
FIG. 5 is a schematic diagram of a dynamic memory of an embodiment of the present invention.

Referring to FIG. 5, the dynamic memory 500 includes a memory array 510 and a controller 520. The memory array 510 and the controller 520 are coupled to each other. The memory array 510 is a DRAM array. The controller 520 can be used to execute multiple steps of the control method of the power down scheme as described in the embodiment of FIG. 1. Relevant details are described in detail in multiple implementation details of FIG. 2A to FIG. 4B, and will not be repeated here.

Figure 6:
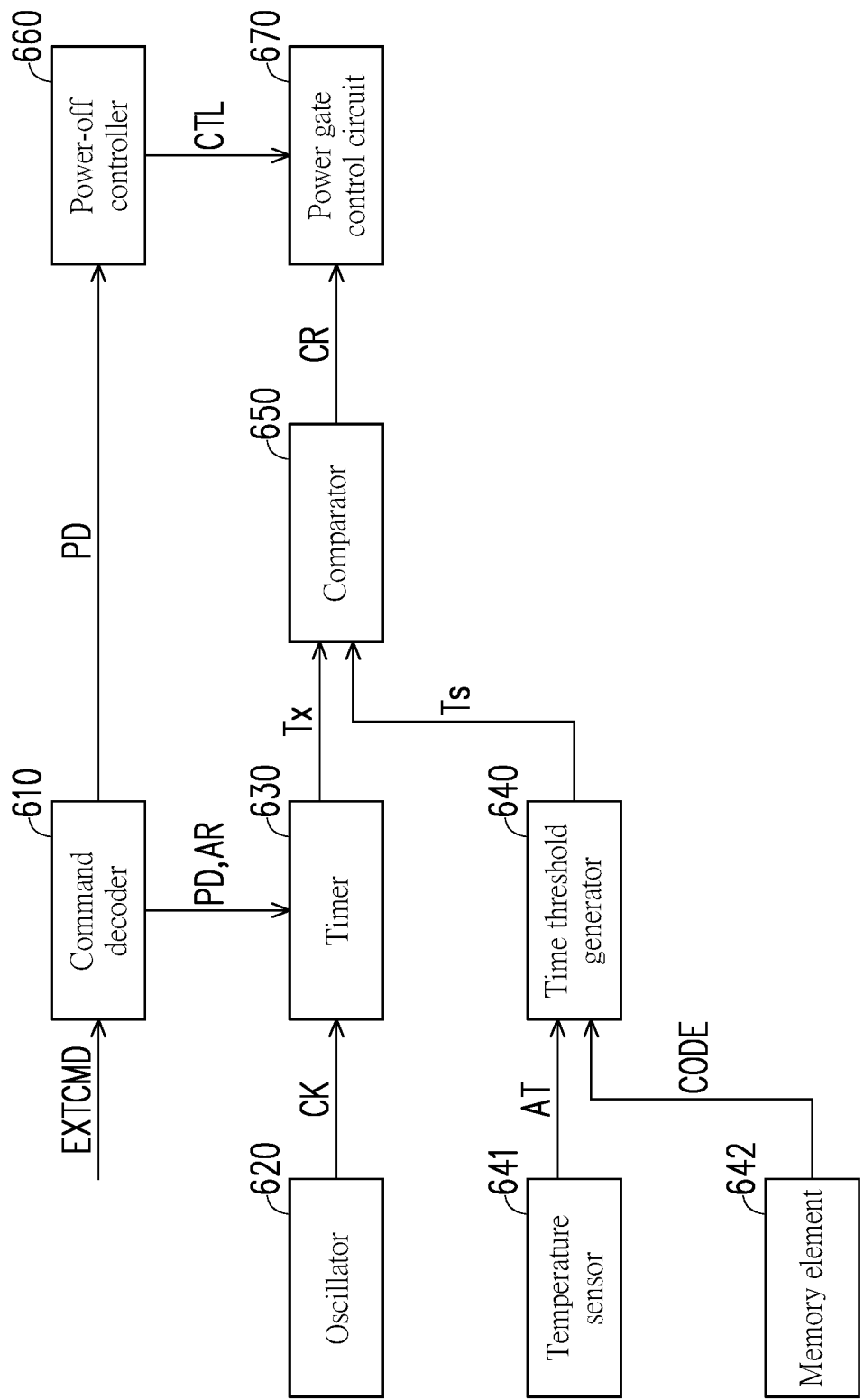
FIG. 6 is a schematic diagram of the implementation of the controller of the dynamic memory of the embodiment of the present invention.

Referring to FIG. 6, the controller includes a command decoder 610, a time threshold generator 640, a timer 630, a comparator 650, a power down controller 660, a power gate control circuit 670, a temperature sensor 641, and a memory element 642. The command decoder 610 is configured to decode an external command EXTCMD, and generate a refresh command AR and a power down command PD. The timer 630 is coupled to the command decoder 610. The timer 630 can perform timing according to the refresh command AR and the power down command PD, and generate a time difference Tx. The timer 630 performs timing operation based on a clock signal CK provided by an oscillator 620.

The time threshold generator 640 is coupled to the temperature sensor 641, the memory element 642 and the comparator 650. The temperature sensor 641 is configured to sense ambient temperature AT. The memory element 642 is configured to provide a preset parameter CODE to the time threshold generator 640. The time threshold generator 640 can select the preset parameter CODE provided by the memory element 642 according to the ambient temperature AT, so as to obtain a time threshold Ts. Among them, the preset parameter CODE stored in the memory element 642 is used to represent the relationship information between multiple temperatures and multiple time thresholds. The memory element 642 may be a non-volatile memory, such as any form of read-only memory.

The comparator 650 is configured to compare the time threshold Ts with the time difference Tx to generate an activating signal CR. The activating signal CR is used to indicate whether to activate the low power operation mode of the dynamic memory.

The power down controller 660 is coupled to the command decoder 610, and enables a power down control signal CTL according to the power down command PD. The power gate control circuit 670 is coupled to the comparator 650 and the power down controller 660. The power gate control circuit 670 cuts off the path for the circuit elements of the dynamic memory to receive the supply voltage according to the power down control signal CTL and the activating signal CR under the low power operation mode.

In the embodiment, the command decoder 610, the time threshold generator 640, the timer 630, the comparator 650, the power down controller 660, and the power gate control circuit 670 can be implemented by applying digital circuits. The relevant hardware architecture can be generated by using digital circuit design methods well known to those skilled in the art, without specific limitations.

Figure 7:
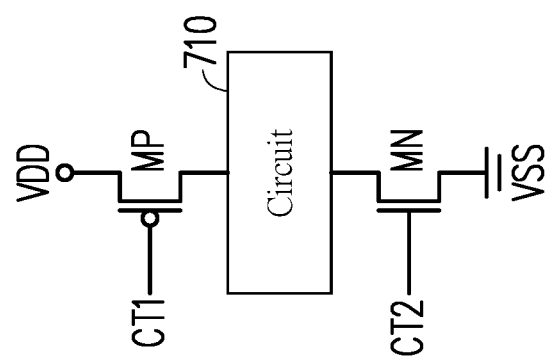
FIG. 7 is a schematic diagram of the operation mode of the low power operation mode of the dynamic memory of the embodiment of the present invention.

For details of the operation of the low power operation mode, refer to FIG. 7 The circuit 710 in the dynamic memory can receive supply voltage VDD through a transistor MP, and receive reference ground voltage VSS through a transistor MN. The controller can generate control signals CT1, CT2, and provide the control signals CT1, CT2 to the control terminals of the transistor MP and the transistor MN respectively. When the dynamic memory enters the low power operation mode, the controller disables the transistor MP and the transistor MN through the generated control signals CT1 and CT2. And, by cutting off the path of the circuit 710 receiving the supply voltage VDD and the reference ground voltage VSS, the power consumption of the circuit 710 is reduced.

In the embodiment, the circuit 710 includes one or more electronic components. The circuit 710 is a circuit in the dynamic memory, which may not need operation under the low power operation mode.

In summary, the dynamic memory of the present invention does not directly enter the low power operation mode when receiving the power down command. The dynamic memory of the present invention makes the dynamic memory enter the low power operation mode after confirming that the switching operation of the low power operation mode has the benefit of saving power consumption by judging the state of the auto-refresh operation. In this way, the power utilization efficiency of the dynamic memory can be further improved.

What is claimed is:

1. A control method for power down scheme, comprising:
receiving a power down command at a first time point;
judging whether the first time point is in an operation period of a burst refresh operation;
if the first time point is not in the operation period of the burst refresh operation:
calculating a time difference between the first time point and a time point of a next refresh operation according to a second time point of a previous refresh operation and a refresh operation time interval, and
determining to activate a low power operation mode of a dynamic memory when the time difference is greater than a preset time threshold.

2. The control method according to claim 1, further comprises:
subtracting the difference between the second time point and the first time point from the refresh operation time interval to obtain the time difference; and
comparing the time difference with the time threshold to determine whether to activate the low power operation mode.

3. The control method according to claim 1, wherein the time difference is not greater than the time threshold, further comprises:

determining whether the dynamic memory enters a postpone refresh mode; and when the dynamic memory enters the postpone refresh mode, determining whether to activate the low power operation mode of the dynamic memory according to a setting parameter of the postpone refresh mode, the refresh operation time interval, and the time threshold.

4. The control method according to claim 3, further comprises:

when the power down command is continued and when the time interval between the second time point and a current time is greater than the sum of the refresh operation time interval and a threshold value, judging that the dynamic memory enters the postpone refresh mode.

5. The control method according to claim 4, further comprises:

judging whether the product of the refresh operation time interval and the setting parameter is greater than the time threshold in the postpone refresh mode; and when the product of the refresh operation time interval and the setting parameter is greater than the time threshold, activating the low power operation mode.

6. The control method according to claim 1, further comprises:

cutting off a path for a circuit element of the dynamic memory to receive supply voltage in the low power operation mode.

7. The control method according to claim 1, wherein the step of judging whether the first time point is in the operation period of the burst refresh operation comprises:

judging whether the time interval between the second time point of the previous refresh operation and the first time point is greater than a period of a row auto-refresh loop; and when the time interval between the second time point and the first time point is greater than the period of the row auto-refresh loop, judging that the first time point is not in the operation period of the burst refresh operation.

8. A dynamic memory, comprising:
a memory array; and
a controller, coupled to the memory array, is configured to:
receiving a power down command at a first time point;
judging whether the first time point is in an operation period of a burst refresh operation;
if the first time point is not in the operation period of the burst refresh operation:
calculating a time difference between the first time point and a time point of a next refresh operation according to a second time point of a previous refresh operation and a refresh operation time interval; and
determining to activate a low power operation mode of the dynamic memory when the time difference is greater than a preset time threshold.

9. The dynamic memory according to claim 8, wherein the controller is further configured to:

subtracting the difference between the second time point and the first time point from the refresh operation time interval to obtain the time difference; and comparing the time difference with the time threshold to determine whether to activate the low power operation mode.

10. The dynamic memory according to claim 8, wherein the controller is further configured to:

determining whether the dynamic memory enters a postpone refresh mode; and when the dynamic memory enters the postpone refresh mode, determining whether to activate the low power operation mode of the dynamic memory according to a setting parameter of the postpone refresh mode, the refresh operation time interval, and the time threshold.

11. The dynamic memory according to claim 10, wherein the controller is further configured to:

when the power down command is continued and when the time interval between the second time point and a current time is greater than the sum of the refresh operation time interval and a threshold value, judging that the dynamic memory enters the postpone refresh mode.

12. The dynamic memory according to claim 11, wherein the controller is further configured to:

judging whether the product of the refresh operation time interval and the setting parameter is greater than the time threshold in the postpone refresh mode; and when the product of the refresh operation time interval and the setting parameter is greater than the time threshold, activating the low power operation mode.

13. The dynamic memory according to claim 8, wherein the controller is further configured to:

cutting off a path for a circuit element of the dynamic memory to receive supply voltage in the low power operation mode.

14. The dynamic memory according to claim 8, wherein the controller is further configured to:

judging whether the time interval between the second time point of the previous refresh operation and the first time point is greater than a period of a row auto-refresh loop; and when the time interval between the second time point and the first time point is greater than the period of the row auto-refresh loop, judging that the first time point is not in the operation period of the burst refresh operation.

15. The dynamic memory according to claim 8, wherein the controller further comprises:

a command decoder, configured to decode a decode an external command, and generate a refresh command and the power down command;

a time threshold generator, configured to generate a time threshold;

a timer, coupled to the command decoder, is configured to perform timing according to the refresh command and the power down command, and generate the time difference;

a comparator, configured to compare the time threshold and the time difference to generate an activating signal;

a power down controller, configured to enable a power down control signal according to the power down command; and a power gate control circuit, coupled to the comparator and the power down controller, is configured to cut off a path of a circuit element of the dynamic memory receiving supply voltage according to the power down command and the activating signal.

16. The dynamic memory according to claim 15, wherein the controller further comprises:

a temperature sensor, configured to sense ambient temperature; and a memory element, coupled to the time threshold generator, is configured to provide a preset parameter, wherein the time threshold generator generates the time threshold according to the ambient temperature and the preset parameter.

* * * * *